(12) United States Patent
Fish et al.

(10) Patent No.: US 11,437,786 B2
(45) Date of Patent: *Sep. 6, 2022

(54) POLARIZATION INSENSITIVE COLORLESS OPTICAL DEVICES

(71) Applicant: OpenLight Photonics, Inc., Goleta, CA (US)

(72) Inventors: Gregory Alan Fish, Santa Barbara, CA (US); Erik Johan Norberg, Santa Barbara, CA (US); John M. Garcia, Santa Barbara, CA (US); Robert Silvio Guzzon, Santa Barbara, CA (US); Daniel Knight Sparacin, Washington, DC (US)

(73) Assignee: OpenLight Photonics, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/940,835

(22) Filed: Jul. 28, 2020

(65) Prior Publication Data

US 2020/0358258 A1 Nov. 12, 2020

Related U.S. Application Data

(63) Continuation of application No. 16/561,635, filed on Sep. 5, 2019, now Pat. No. 10,756,516, which is a (Continued)

(51) Int. Cl.
*H01S 5/50* (2006.01)
*G02B 27/28* (2006.01)
(Continued)

(52) U.S. Cl.
CPC ............ *H01S 5/5018* (2013.01); *G02B 6/126* (2013.01); *G02B 27/283* (2013.01);
(Continued)

(58) Field of Classification Search
CPC .... G02B 27/283; G02B 27/286; G02B 6/126; G02B 6/2793; H01S 5/005; H01S 5/0085;
(Continued)

(56) References Cited

U.S. PATENT DOCUMENTS

| 4,752,120 | A | | 6/1988 | Shimizu | |
|---|---|---|---|---|---|
| 4,900,917 | A | * | 2/1990 | Dixon | H04B 10/27 250/225 |

(Continued)

OTHER PUBLICATIONS

Silvio et al; FDMA-PON architecture according to the FABULOUS European project; Feb. 2013; SPIE digital library; pp. 1-7. (Year: 2013).*

(Continued)

*Primary Examiner* — Amritbir K Sandhu
(74) *Attorney, Agent, or Firm* — Schwegman Lundberg & Woessner, P.A.

(57) ABSTRACT

Embodiments of the invention describe polarization insensitive optical devices utilizing polarization sensitive components. Light comprising at least one polarization state is received, and embodiments of the invention select a first optical path for light comprising a first polarization state or a second optical path for light comprising a second polarization state orthogonal to the first polarization state. The optical paths include components to at least amplify and/or modulate light comprising the first polarization state; the second optical path includes a polarization rotator to rotate light comprising the second polarization state to the first polarization state. Embodiments of the invention further describe optical devices including a polarization mode converter to convert light comprising a first and a second polarization state to light comprising different spatial modes of the first polarization state; light comprising the different spatial modes of the first polarization state is subsequently amplified and modulated.

20 Claims, 9 Drawing Sheets

US 11,437,786 B2

Page 2

Related U.S. Application Data continuation of application No. 15/498,833, filed on Apr. 27, 2017, now Pat. No. 10,468,854, which is a continuation of application No. 14/318,468, filed on Jun. 27, 2014, now Pat. No. 9,647,426.

(60) Provisional application No. 61/841,029, filed on Jun. 28, 2013.

(51) Int. Cl.

| H04J 14/06 | (2006.01) |
|---|---|
| H04J 14/02 | (2006.01) |
| H04B 10/50 | (2013.01) |
| G02B 6/126 | (2006.01) |
| H01S 5/00 | (2006.01) |
| H01S 5/068 | (2006.01) |
| G02B 6/27 | (2006.01) |

(52) U.S. Cl.
CPC .......... *G02B 27/286* (2013.01); *H01S 5/0085* (2013.01); *H01S 5/068* (2013.01); *H01S 5/5009* (2013.01); *H04B 10/505* (2013.01); *H04J 14/02* (2013.01); *H04J 14/06* (2013.01); *G02B 6/2793* (2013.01); *H01S 5/005* (2013.01)

(58) Field of Classification Search
CPC ...... H01S 5/068; H01S 5/5009; H01S 5/5018; H04B 10/505; H04J 14/02; H04J 14/06
USPC .................................................. 398/140, 152
See application file for complete search history.

(56) References Cited

U.S. PATENT DOCUMENTS

| 5,416,628 | A | 5/1995 | Betti et al. |
| 5,495,366 | A | 2/1996 | Esman et al. |
| 5,544,268 | A | 8/1996 | Bischel et al. |
| 5,654,818 | A * | 8/1997 | Yao .......................... G02F 1/035 359/254 |
| 6,862,130 | B2 | 3/2005 | Batchko et al. |
| 7,002,733 | B2 * | 2/2006 | Dagenais ........... H04B 10/2914 359/344 |
| 7,010,234 | B2 | 3/2006 | Chaput |
| 8,885,679 | B1 | 11/2014 | Roth et al. |
| 8,964,284 | B2 * | 2/2015 | Ziari .................. H04B 10/2914 359/344 |
| 9,122,006 | B1 | 9/2015 | Roth et al. |
| 9,647,426 | B1 | 5/2017 | Fish et al. |
| 10,330,959 | B2 * | 6/2019 | Wen ........................ G02F 1/011 |
| 10,468,854 | B1 | 11/2019 | Fish et al. |
| 10,756,516 | B2 * | 8/2020 | Fish ........................ H04J 14/02 |
| 2004/0150876 | A1 | 8/2004 | Dagenais et al. |
| 2004/0165808 | A1 | 8/2004 | Lauzon |
| 2005/0238363 | A1 | 10/2005 | Jennen et al. |
| 2006/0159463 | A1 * | 7/2006 | Futami ..................... G01J 11/00 398/152 |
| 2007/0086784 | A1 | 4/2007 | Lee et al. |
| 2008/0063409 | A1 | 3/2008 | Toliver |
| 2010/0054753 | A1 | 3/2010 | Futami et al. |
| 2010/0296161 | A1 | 11/2010 | Little et al. |
| 2010/0302637 | A1 * | 12/2010 | Little ................... G02B 6/2793 359/489.08 |
| 2011/0292951 | A1 * | 12/2011 | Qiu ...................... G01C 19/721 372/6 |
| 2012/0121220 | A1 | 5/2012 | Krummrich |
| 2013/0028611 | A1 | 1/2013 | Amit |
| 2013/0156361 | A1 * | 6/2013 | Kojima .................... G02B 6/14 385/11 |
| 2013/0216228 | A1 | 8/2013 | Nazarathy et al. |
| 2013/0223843 | A1 | 8/2013 | Jia et al. |
| 2013/0294765 | A1 * | 11/2013 | Okamoto ............. H04B 10/671 398/25 |
| 2014/0348460 | A1 | 11/2014 | Dorin et al. |
| 2015/0260914 | A1 | 9/2015 | Zheng et al. |
| 2016/0246005 | A1 * | 8/2016 | Liu ......................... G02B 6/126 |
| 2016/0261352 | A1 * | 9/2016 | Wen .................. H04B 10/5053 |
| 2016/0337041 | A1 * | 11/2016 | Wen .................. H04B 10/2575 |
| 2018/0143460 | A1 | 5/2018 | Wen et al. |
| 2019/0049743 | A1 * | 2/2019 | Akiyama ................ H01S 5/005 |
| 2019/0393681 | A1 | 12/2019 | Fish et al. |

OTHER PUBLICATIONS

Menzeo et al; Reflective Silicon Mach Zehnder Modulator with Faraday Rotator Mirror effect for self-coherent transmission; 2013; OFC/NFOEC Technical digest; pp. 1-3. (Year: 2013).*

Silvio et al; FDMA-POM architecture according to the FABULOUS European Project; 2013; SPIE digital library; pp. 1-8. (Year: 2013).*

Menezo et al; Reflective Silicon Mach Zehnder Modulator with Faraday Rotator mirror effect for self coherent transmission; 2013; OFC/NFOEC technical digest; pp. 1-3. (Year: 2013).*

Menezo et al; Reflective Silicon Mach Zehnder Modulator With Faraday Rotator Mirror effect for self-coherent transmission; 2013; Optical society of America, pp. 1-3. (Year: 2013).*

U.S. Appl. No. 14/318,468 U.S. Pat. No. 9,647,426, filed Jun. 27, 2014, Polarization Insensitive Colorless Optical Devices.

U.S. Appl. No. 15/498,833 U.S. Pat. No. 10,468,854, filed Apr. 27, 2017, Polarization Insensitive Colorless Optical Devices.

U.S. Appl. No. 16/561,635, filed Sep. 5, 2019, Polarization Insensitive Colorless Optical Devices.

"U.S. Appl. No. 14/318,468, Non Final Office Action dated Aug. 3, 2016", 24 pgs.

"U.S. Appl. No. 14/318,468, Notice of Allowance dated Jan. 31, 2017", 14 pgs.

"U.S. Appl. No. 14/318,468, Response filed Nov. 29, 2016 to Non Final Office Action dated Aug. 3, 2016", 17 pgs.

"U.S. Appl. No. 15/498,833, Final Office Action dated Feb. 8, 2019".

"U.S. Appl. No. 15/498,833, Non Final Office Action dated Apr. 25, 2019".

"U.S. Appl. No. 15/498,833, Non Final Office Action dated Aug. 31, 2018".

"U.S. Appl. No. 15/498,833, Notice of Allowance dated Aug. 14, 2019", 10 pgs.

"U.S. Appl. No. 15/498,833, Preliminary Amendment filed Apr. 27, 2017", 8 pgs.

"U.S. Appl. No. 15/498,833, Response filed Apr. 8, 2019 to Final Office Action dated Feb. 8, 2019", 17 pgs.

"U.S. Appl. No. 15/498,833, Response filed Nov. 29, 2018 to Non Final Office Action dated Aug. 31, 2018", 13 pgs.

"U.S. Appl. No. 15/498,833, Response filed Jul. 25, 2019 to Non-Final Office Action dated Apr. 25, 2019", 15 pgs.

"U.S. Appl. No. 16/561,635, Final Office Action dated Feb. 7, 2020", 19 pgs.

"U.S. Appl. No. 16/561,635, Non Final Office Action dated Sep. 26, 2019", 36 pgs.

"U.S. Appl. No. 16/561,635, Notice of Allowance dated Apr. 22, 2020", 10 pgs.

"U.S. Appl. No. 16/561,635, Response filed Apr. 7, 2020 to Final Office Action dated Feb. 7, 2020", 8 pgs.

"U.S. Appl. No. 16/561,635, Response filed Dec. 31, 2019 to Non Final Office Action dated Sep. 26, 2019", 11 pgs.

Charbonnier, B, et al., "Reflective polarisation independent Mach-Zenhder modulator for FDMA/OFDMA PON", Electronics Letters vol. 46 No. 25, (Dec. 9, 2010), 2 pgs.

Tang, Poon, et al., "Proposal for a Grating Waveguide Serving as Both a Polarization Splitter and an Efficient Coupler for Silicon-on-lnsulator Nanophotonic Circuits", IEEE Photonics Technology Letters, vol. 21, No. 4, (Feb. 15, 2009), 242-244.

* cited by examiner

POLARIZATION INSENSITIVE COLORLESS OPTICAL DEVICES

PRIORITY

This application is a continuation of U.S. application Ser. No. 16/561,635, filed Sep. 5, 2019, which is a continuation of U.S. application Ser. No. 15/498,833, filed. Apr. 27, 2017 continuation of U.S. application Ser. No. 14/318,468, filed Jun. 27, 2014 which claims the benefit of U.S. Provisional Application No. 61/841,029 filed Jun. 28, 2013, the entire contents each of which are hereby incorporated by reference herein in their entirety.

FIELD

Embodiments of the invention generally pertain to optical devices and more specifically to polarization insensitive optical devices.

BACKGROUND

Semiconductor optical devices, such as amplifiers and modulators, typically have different optical effects for different polarization states. Solutions to create consistent optical effects for different polarization states include using bulk materials with a specific strain (i.e., tuning a material's opto-electrical properties by altering its structure), mixed strained quantum wells, and quantum wells with a specific strain; however, these solutions suffer a reduced performance compared to highly strained polarization-specific (e.g., transverse electric (TE) and transverse magnetic (TM) mode specific) optical components.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation the invention, Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 2A and FIG. 28 are illustrations of polarization insensitive transceivers according to embodiments of the invention.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DESCRIPTION

Embodiments of the invention describe polarization independent optical devices utilizing one or more polarization ode converters and/or rotators in conjunction with highly strained polarization mode specific optical components, such as optical amplifiers and modulators.

Polarization insensitive optical devices may be used in high performance optical transmission systems. Many optical transmission systems utilize wavelength division multiplexing (WDM), where the transmission channels are carried by optical signals over different wavelengths or different bands of wavelengths. Some WDM systems are described as 'colorless;' these systems utilize a plurality of colorless laser transmitters to provide a plurality of different wavelength channels. A colorless WDM system utilizes a transmitter/transceiver having a plurality of filters to select different wavelength bands for the different multiplexed wavelength channels. Similar or identical laser transmitters may be used to provide the different wavelengths; different types of laser transmitters may also be used without changing the wavelength channels.

Embodiments of the invention may be configured to operate in reflection or transmission and may be paired with an optional receiver to function as a polarization independent colorless WDM receiver. As explained in further detail below, embodiments of the invention may be configured to maintain equal or at least substantially similar path lengths and gain throughout the device so as not to introduce polarization dependent modulation or polarization gain on the modulated output; in other words, embodiments of the invention describe polarization insensitive optical devices that utilize polarization sensitive components.

Throughout this specification, several terms of art are used. These terms are to take on their ordinary meaning in the art from which they come, unless specifically defined herein or the context of their use would clearly suggest otherwise. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Figure 1A:
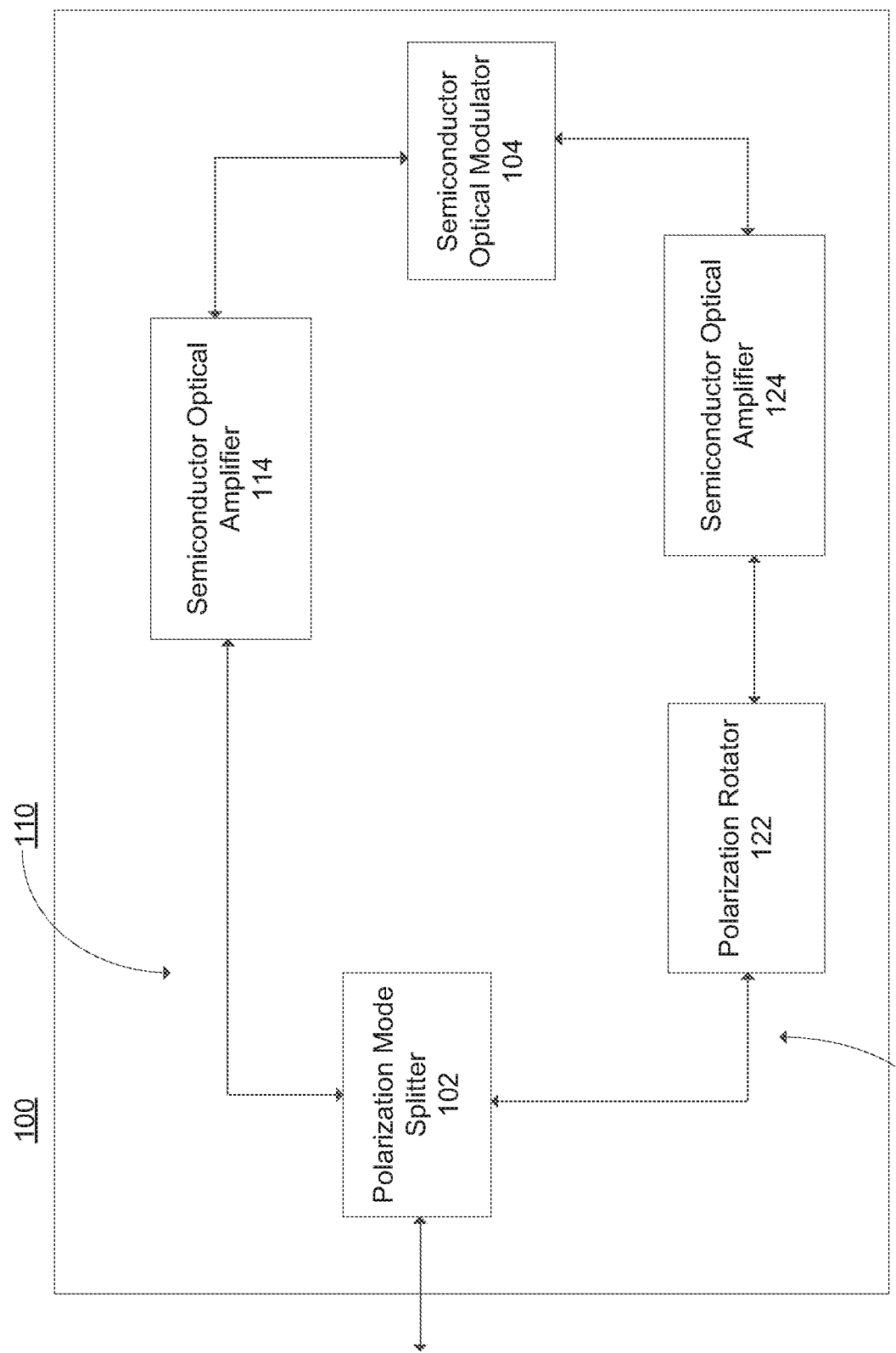
FIG. 1A is an illustration of a polarization insensitive modulator with amplification according to an embodiment of the invention.

FIG. 1A is an illustration of a polarization insensitive, amplified modulator according to an embodiment of the invention. Device 100 of FIG. 1A is illustrated as a polarization insensitive amplified reflective modulator including polarization mode splitter 102, polarization rotator 122, semiconductor optical amplifiers 114 and 124, and optical modulator 104.

Said components of device 100 (as well as components of the other embodiments described below) may comprise discrete components or may be included in a photonic integrated circuit (PIC), such as heterogeneous PICs comprising silicon and a non-silicon material (e.g., III-V material, magneto-optic material, or crystal substrate material). Integrated photonic components in PICs are often polarization sensitive, thus it may be preferable to operate in a single polarization throughout the PIC.

Polarization mode splitter 102 may split received light into separate optical paths based on the polarization state of the received light—i.e., selecting a first optical path for light comprising a first polarization state, and a second optical path for light comprising a second polarization state orthogonal to the first polarization state. In some embodiments, these orthogonal polarization states are polarized transverse electric (TE) and transverse magnetic (TM) modes. In this example, splitter 102 directs light comprising TE0 polarization to optical path 110 and light comprising TM0 polarization to optical path 120; in other embodiments, the split polarization modes may comprise any two modes which are orthogonal to one another, whether of the same or different polarization.

Optical path 120 is shown to include rotator 122 to rotate TM0 polarization mode light to TE0 polarization mode light. Rotator 122 may comprise any rotator means capable of 90 degree polarization rotation (e.g., half-wave plates, quarter-wave plates, etc.). Thus, light in both optical paths 110 and 120 comprise TE0 mode light at this portion of device 100, enabling the remaining components of the device to comprise the same types of components, thereby ensuring consistent performance for all polarization modes. Embodiments of the invention may therefore use highly strained polarization-specific optical components for each optical path, and for shared optical components.

Thus, semiconductor optical amplifiers (alternatively referred to herein as SOAs) 114 and 124 may be any optical amplifier utilizing a semiconductor for gain medium (e.g., any direct bandgap semiconductor). As discussed above, SOAs 114 and 124 may both be configured to receive TE0 mode light; in other words, the SOAs may each comprise the same component type as they are both amplifying TE0 mode light. Modulator 104 may be a high-speed component shared by optical paths 110 and 120, because at this stage of the device, light from both paths comprise TE0 mode light.

In this embodiment, light from modulator 104 is reflected back onto its original optical path; thus light reflected back to optical path 110 remains TE0 mode light throughout, while light from optical 120 is rotated from TE0 mode light back to TM0 mode light via rotator 122. Thus, embodiments of the invention provide the same amplification and modulation regardless of the polarization of the received light, and reflect back the light in its original polarization state.

In the embodiment illustrated in FIG. 1A, light is described as having the same polarization mode and spatial mode in optical paths 110 and 120. In other embodiments, different spatial modes of a polarization mode in addition to the fundamental TE0/TM0 mode (e.g., TE1/TM1 mode light) are utilized; the different spatial modes of the same polarization mode may still be amplified or modulated with a high degree of similarity.

Figure 1B:
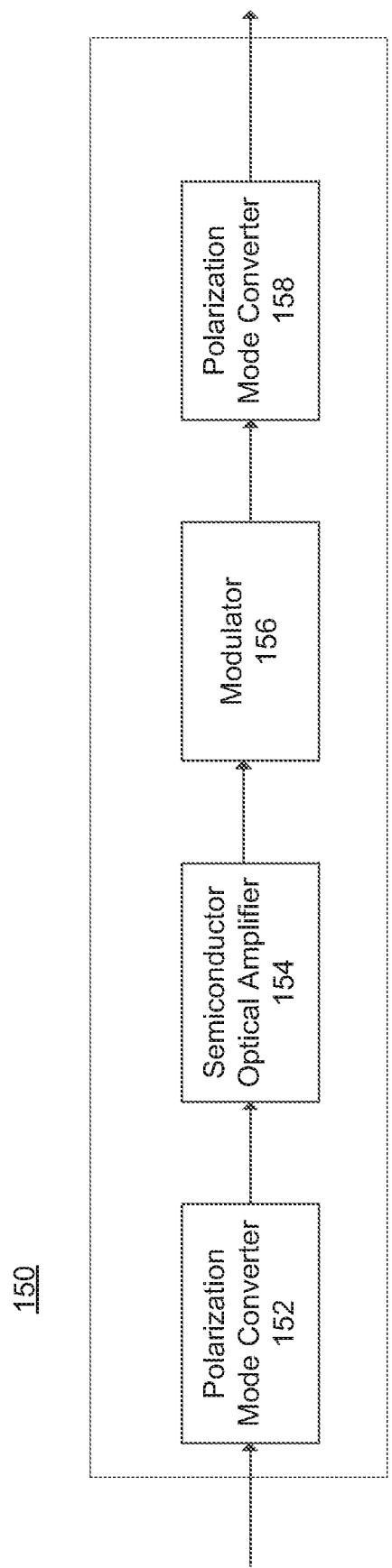
FIG. 1B is a block diagram of a polarization insensitive transmissive modulator with amplification according to an embodiment of the invention.

FIG. 1B is a block diagram of a polarization insensitive transmissive device according to an embodiment of the invention. Device 150 of FIG. 1B is illustrated as including polarization mode converters 152 and 158, semiconductor optical amplifier 154 and optical modulator 156. In other embodiments, rather than a transmissive device, a mirror is utilized in place of polarization mode converter 158 for reflective devices.

In contrast to device 100 of FIG. 1A, which selects for the received light one of a plurality of optical paths based on its polarization state, device 150 converts one or more orthogonal polarization states to a different spatial mode. For example, polarization mode converter 152 may pass TE0 mode light, but convert TM0 mode light to TE1 mode light. In another example, polarization mode converter 152 may rotate received TM0 mode light to TE0 mode light, and change the spatial mode order of received TE0 mode light to TE1 mode light. In either example, the different spatial modes may still be amplified, via semiconductor optical amplifier 154 and modulated via modulator 156 with a high degree of similarity. The light is then converted to its original polarization/spatial mode via converter 158.

Figure 2A:
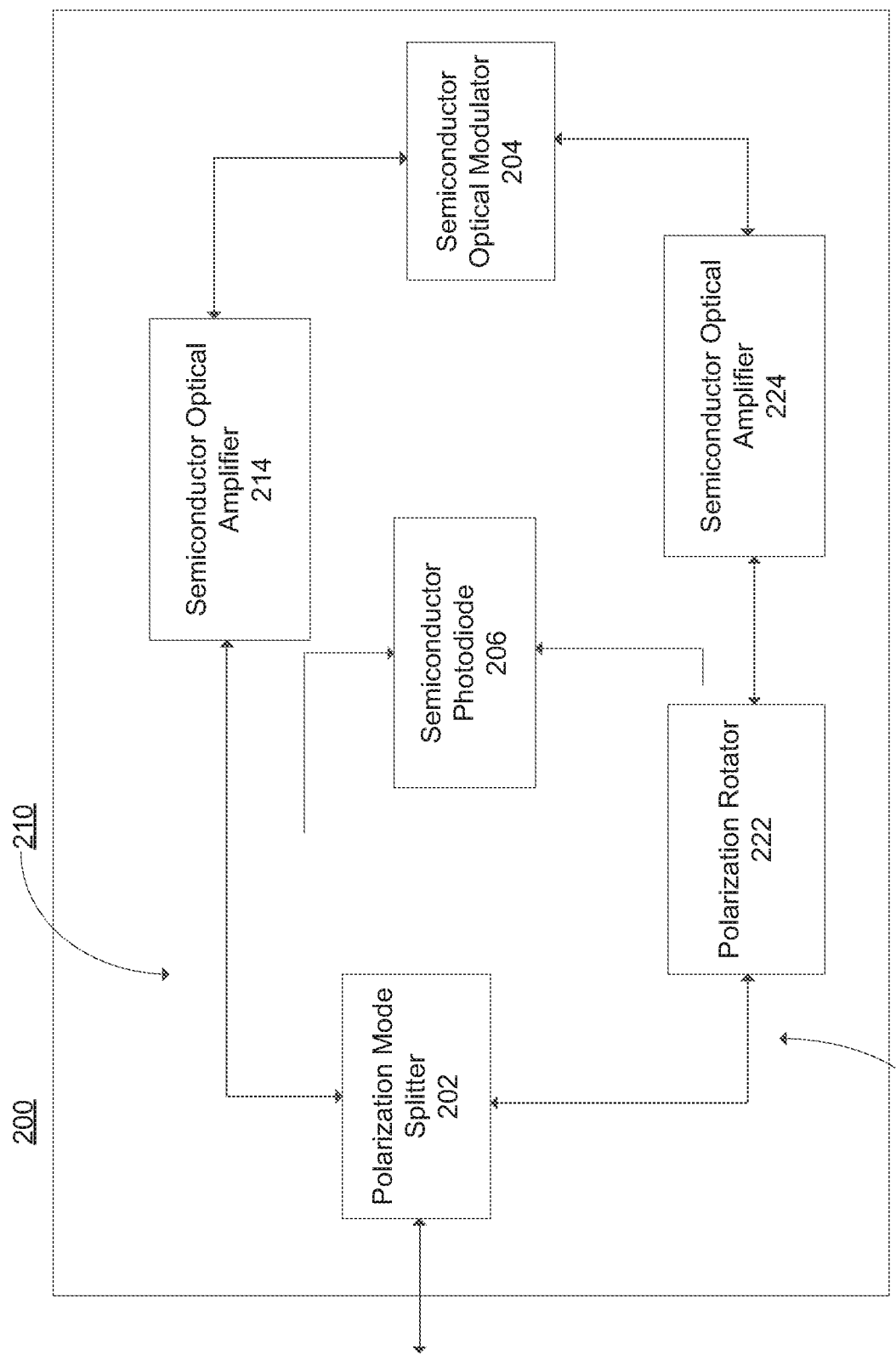
Figure 2B:
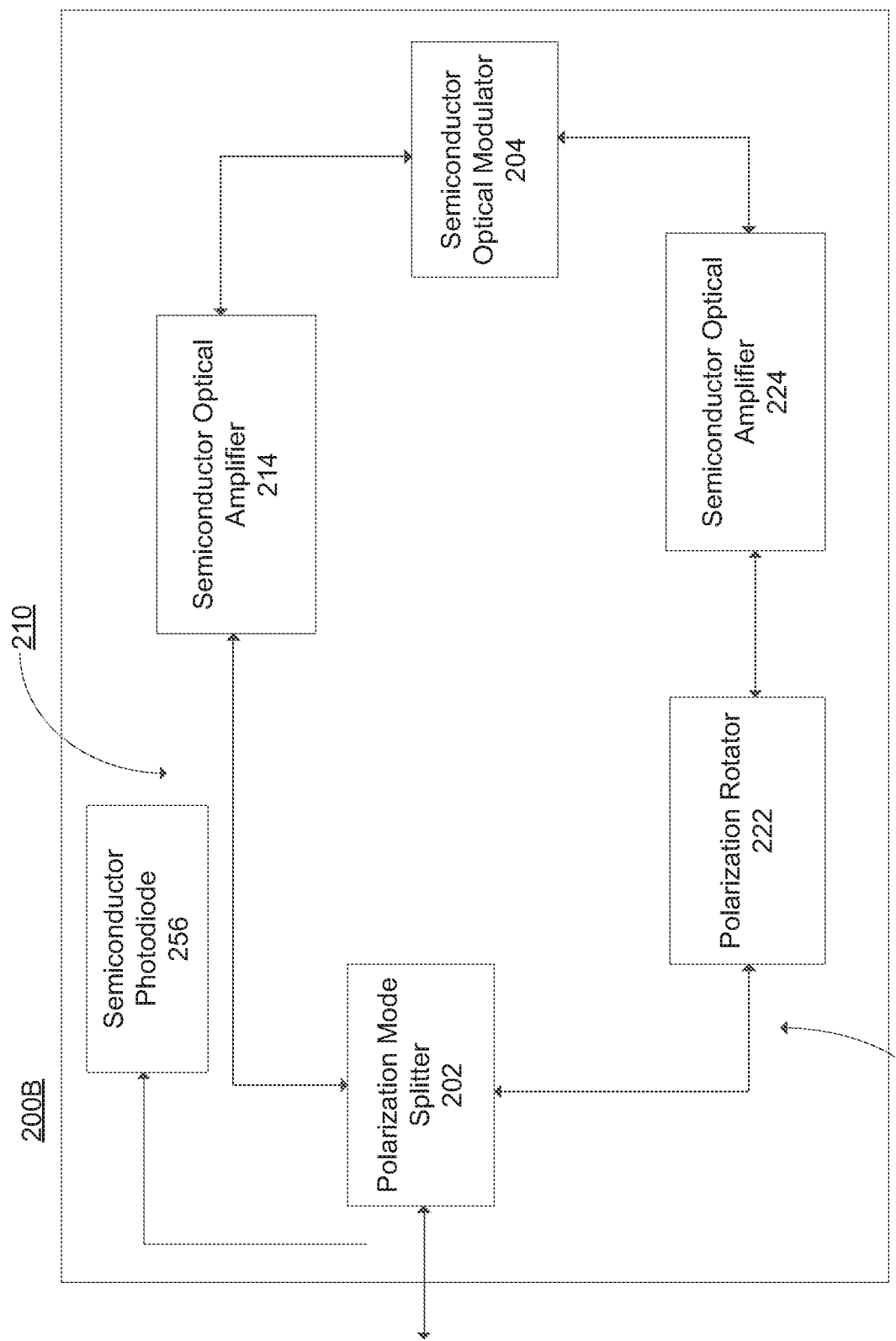

FIG. 2A and FIG. 2B are illustrations of polarization insensitive transceivers according to embodiments of the invention. Device 200 of FIG. 2A is illustrated as a polarization insensitive amplified reflective transceiver including polarization mode splitter 202, polarization rotator 222, semiconductor optical amplifiers 214 and 224, and optical modulator 204.

In this embodiment viewing FIG. 2A from left to right illustrates transceiver 200 functioning as a receiver, while viewing FIG. 2A from right to left illustrates device 200 functioning as a transmitter. While shown to comprise a transceiver, devices may comprise a receiver/transmitter only in other embodiments of the invention. Optical transceivers according embodiments of the invention may be in any configuration where said transceiver includes a transmitter part that transmits one or more optical signals and a receiver part that receives one or more optical signals. Optical transceivers, such as optical WDM transceivers, may be used by optical fiber transmission systems to both transmit and receive data by combining a number of different optical channels or signals at different WDM wavelengths onto a single fiber; light at these WDM wavelengths may be modulated at different WDM wavelengths to carry data of different signals.

Similar to the example embodiment illustrated in FIG. 1A, polarization mode splitter 202 may split received light into optical paths 210 and 220 based on the polarization state of the received light—i.e., splitter 202 directs light comprising TE0 polarization to optical path 210 and light comprising TM0 polarization to optical path 220. Device 200 similarly provides the same amplification and modulation regardless of the polarization of the received light, and reflects back the light in its original polarization state.

In this embodiment, photodiode 206 (via, for example, a splitter (not shown)) receives optical data from paths 210 and 220 for feedback. For example, photodiode 206 may be used to measure the received light to determine the signal intensity or phase of the light; this determined signal intensity or phase may then be used to control optical amplifiers 214/224 and/or modulator 204 so that the intensity or phase of the received light is adjusted. FIG. 2B illustrates a similar embodiment, with device 200B having photodiode 256 to receive light directly from the input, rather than from optical paths 210 and 220.

Figure 3:
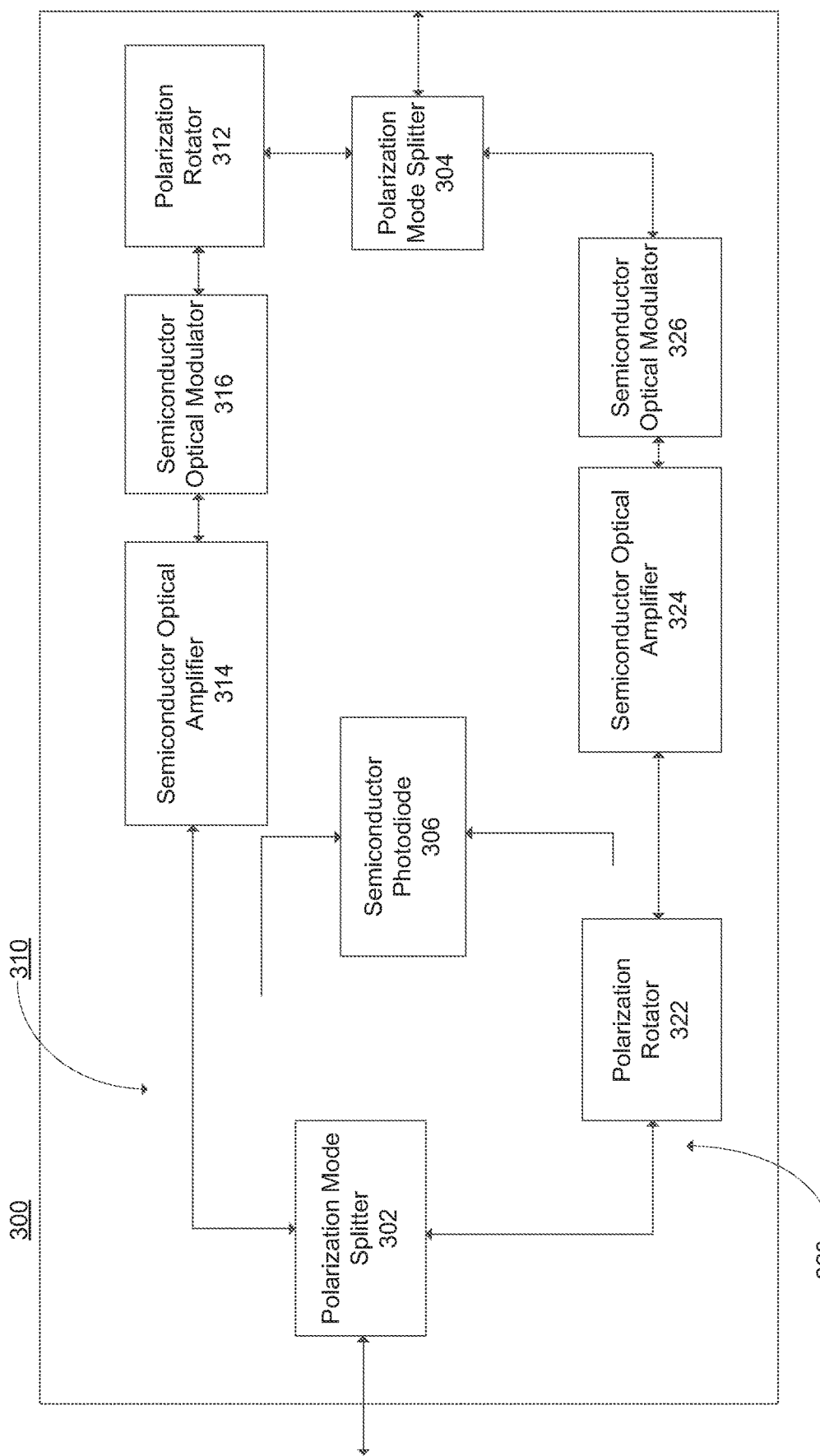
FIG. 3 is an illustration of a polarization insensitive transceiver according to an embodiment of the invention.

FIG. 3 is an illustration of a polarization insensitive transceiver according to an embodiment of the invention. Device 300 is illustrated as a polarization insensitive amplified reflective transceiver including polarization mode splitters 302 and 304, polarization rotators 312 and 322, semiconductor optical amplifiers 314 and 324, and optical modulators 316 and 326. Photodiode 306 receives optical data from paths 310 and 320 for controlling gain/modulation (similar to the embodiment of FIG. 2A discussed above).

Embodiments of the invention may be configured to maintain equal path lengths and gain throughout the device so as not to introduce polarization dependent modulation or polarization dependent gain on the modulated output. While the previous example embodiments included optical paths having substantially similar lengths, in this embodiment optical paths 310 and 320 each comprise the same number and type of components—i.e., each path has a rotator, amplifier and modulator; thus, paths 310 and 320 have an equal path length and equal amounts of loss (such as insertion loss, polarization dependent loss (PDL), polarization mode dispersion (PMD), etc.). For example, rotators 312 and 312 may each have the same rotation-to-loss ratio or at least similar rotation-to-loss ratios.

Figure 4:
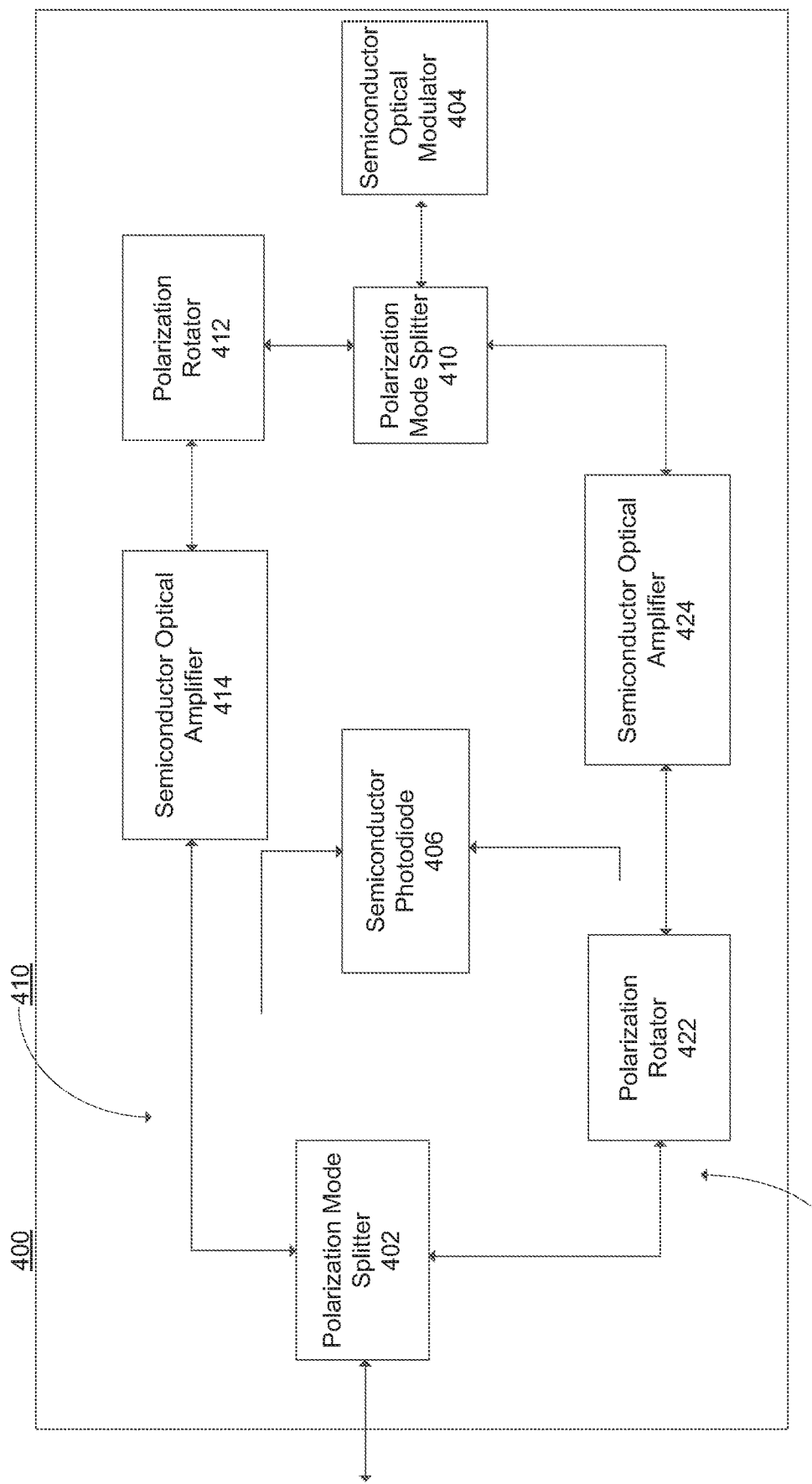
FIG. 4 is an illustration of a polarization insensitive transceiver according to an embodiment of the invention.

FIG. 4 is an illustration of a polarization insensitive transceiver according to an embodiment of the invention. Device 400 of FIG. 4 is illustrated as a polarization insensitive amplified reflective modulator including polarization mode splitters 402 and 410, polarization rotators 412 and 422, semiconductor optical amplifiers 414 and 424, and optical modulator 404. Photodiode 406 receives optical data for feedback to adjust the amplifiers and/or modulators of device 400.

In this embodiment, modulator 404 comprises a polarization insensitive modulator; for example, the structure of modulator 404 may have two arms to modulate two different polarization modes such that phase modulation through a first arm equals the phase modulation of a second arm. In other words, the intensity modulation of modulator 404 is caused to be substantially insensitive to the optical signal's polarization. Therefore in this embodiment, polarization mode splitter 410 functions as a 2×1 switch to transmit any polarized mode light to modulator 404. In other embodiments, other polarization insensitive components, such as polarization insensitive semiconductor optical amplifiers, may be utilized in a similar manner.

Figure 5A:
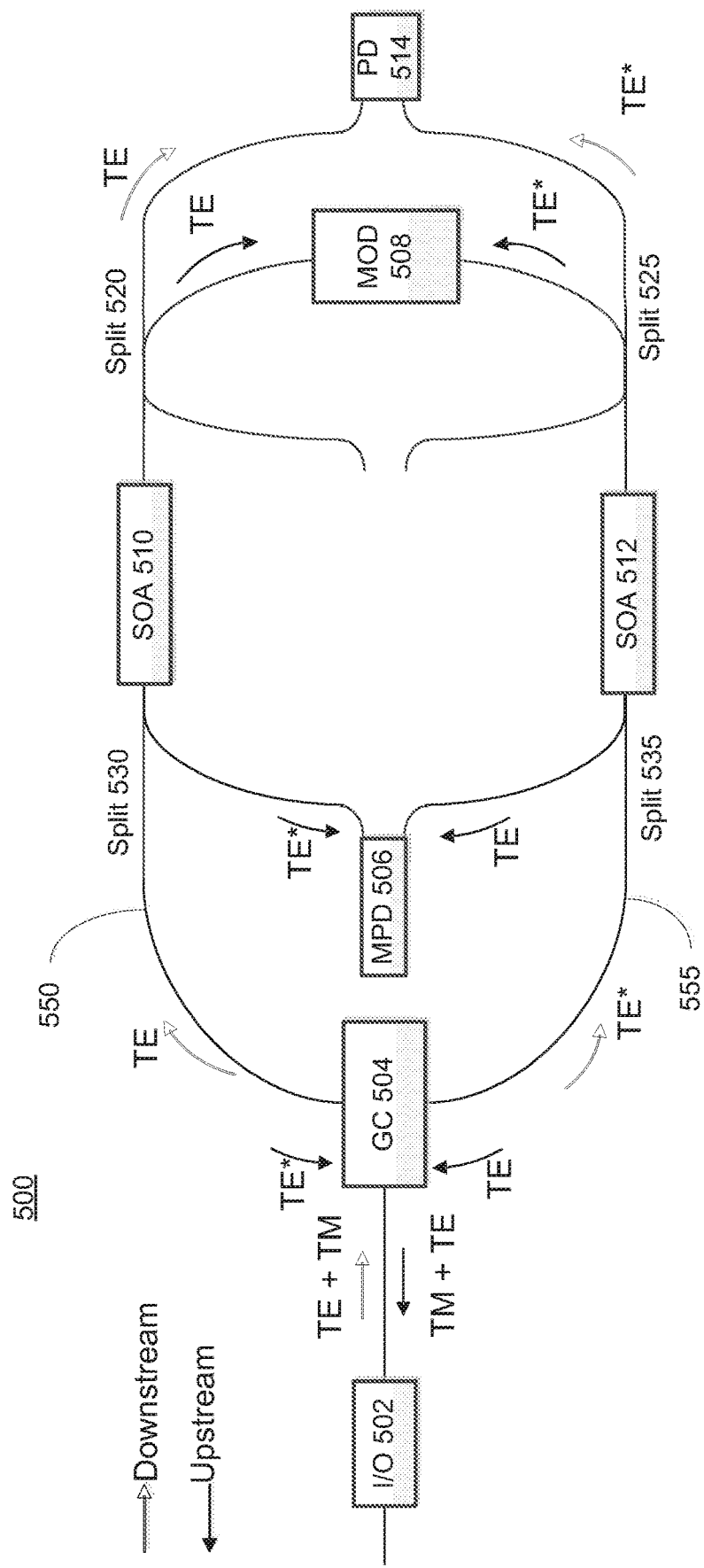
FIG. 5A-FIG. 5B are illustrations of a bi-directional photonic integrated circuit architecture according to an embodiment of the invention.
Figure 5B:
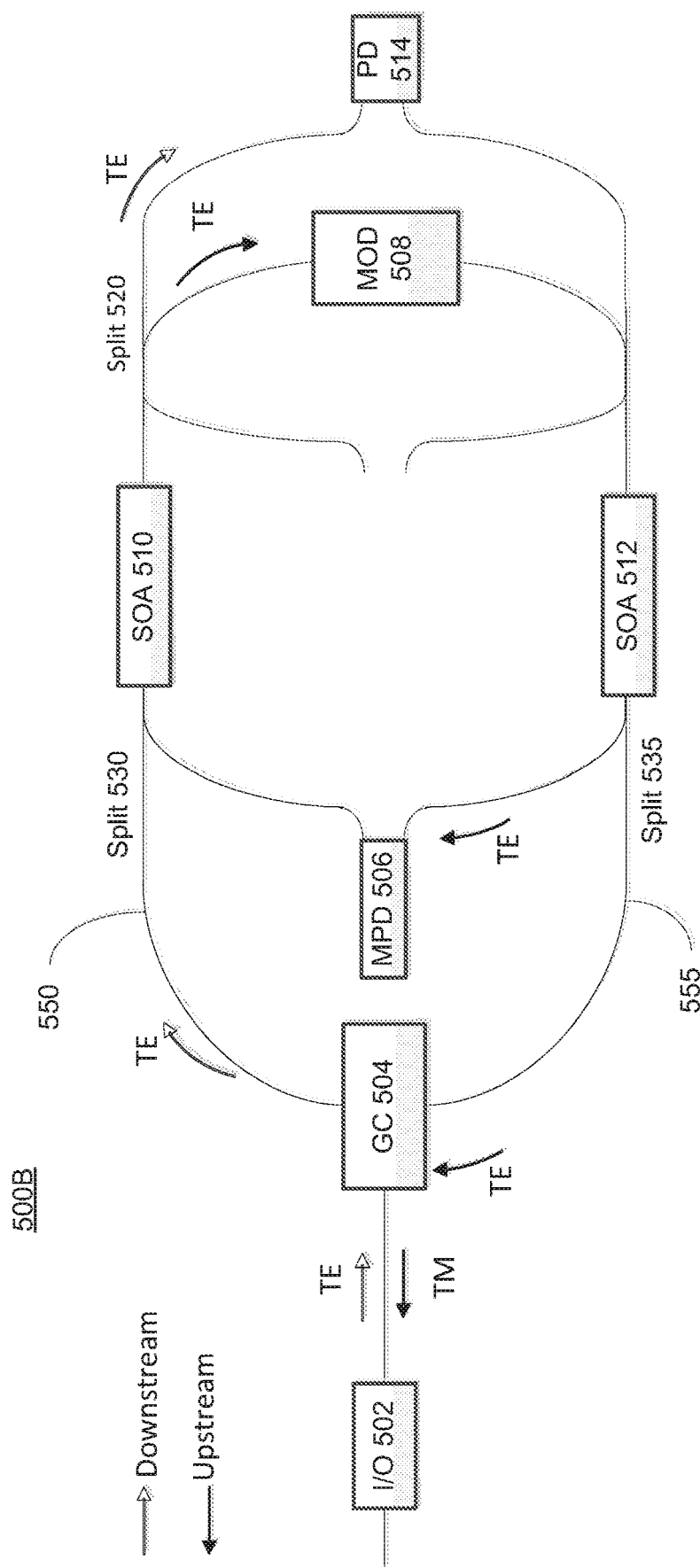

FIG. 5A-FIG. 5B are illustrations of a bi-directional PIC architecture according to an embodiment of the invention. PIC 500 of FIG. 5A is illustrated as including optical input/output (I/O) 502, grating coupler 504, monitor photodiode (MPD) 506, modulator 508, SOAs 510 and 512, and photodiode 514.

In this embodiment, I/O 503 receives/outputs light from/to an optical fiber, and transfers light to/from grating coupler 504 to maximize coupling efficiency. Grating coupler 504 comprises a two-dimensional (2D) grating coupler and splitter configured to split/output orthogonal polarizations of received light (e.g., TE and TM) on to different optical paths. In this embodiment, moving from left-to-right (i.e., shown in FIG. 5A as a "downstream" direction) TE-mode light is shown to be split onto optical path 550, while TM-mode light is shown to be split onto optical path 555. In this example, due to the orientation of grating coupler 504, the light of optical path 555 appears as TE-mode light as well and is illustrated as polarization state TE* (in other words, the placement/orientation of grating coupler 504 with respect to optical path 555 effectively rotates the TM light 90 degrees).

Similar to the embodiments described above, because optical paths 550 and 555 both receive the same polarizations, embodiments of the invention may therefore use highly strained polarization-specific optical components for each optical path, and for shared optical components. Thus, SOAs 510 and 512 may be any optical amplifier utilizing a semiconductor for gain medium (e.g., any direct bandgap semiconductor) configured to receive TE mode light; in other words, the SOAs may each comprise the same component type as they are both amplifying TE mode light. In this embodiment, optical paths 550 and 555 include split paths 520 and 525, respectively. Some of the light received by photodiode 514 is measured in order to adjust the SOAs based on the detected light. The remaining light may be received by modulator 508.

Modulator 508 may be a high-speed component shared by optical paths 550 and 555, because at this stage of the PIC, light from both paths comprise TE mode light. In this embodiment, light from modulator 508 continues onto optical paths 550 and 555 (thereby moving from right-to-left or "upstream" in FIG. 5A). Thus light moving "upstream" on the optical paths remains TE mode light. FIG. 5B illustrates the path of received TE-mode light in PIC 500B to clarify how the light traverses optical paths 550 and 555; the received TM-mode light traverses optical paths 555 and 550 in the opposite direction, and is not shown in FIG. 5B for purposes of functional clarification only.

Referring back to FIG. 5A, split paths 530 and 535 may direct some of the light to MPD 506 (used to adjust modulator 508 based on the detected light), and the remaining light is received/combined by grating coupler 504. In this example, "upstream" light from optical path 555 is rotated to TM mode, and light output from grating coupler 504 to I/O 502 comprises TM+TE mode light.

Figure 6:
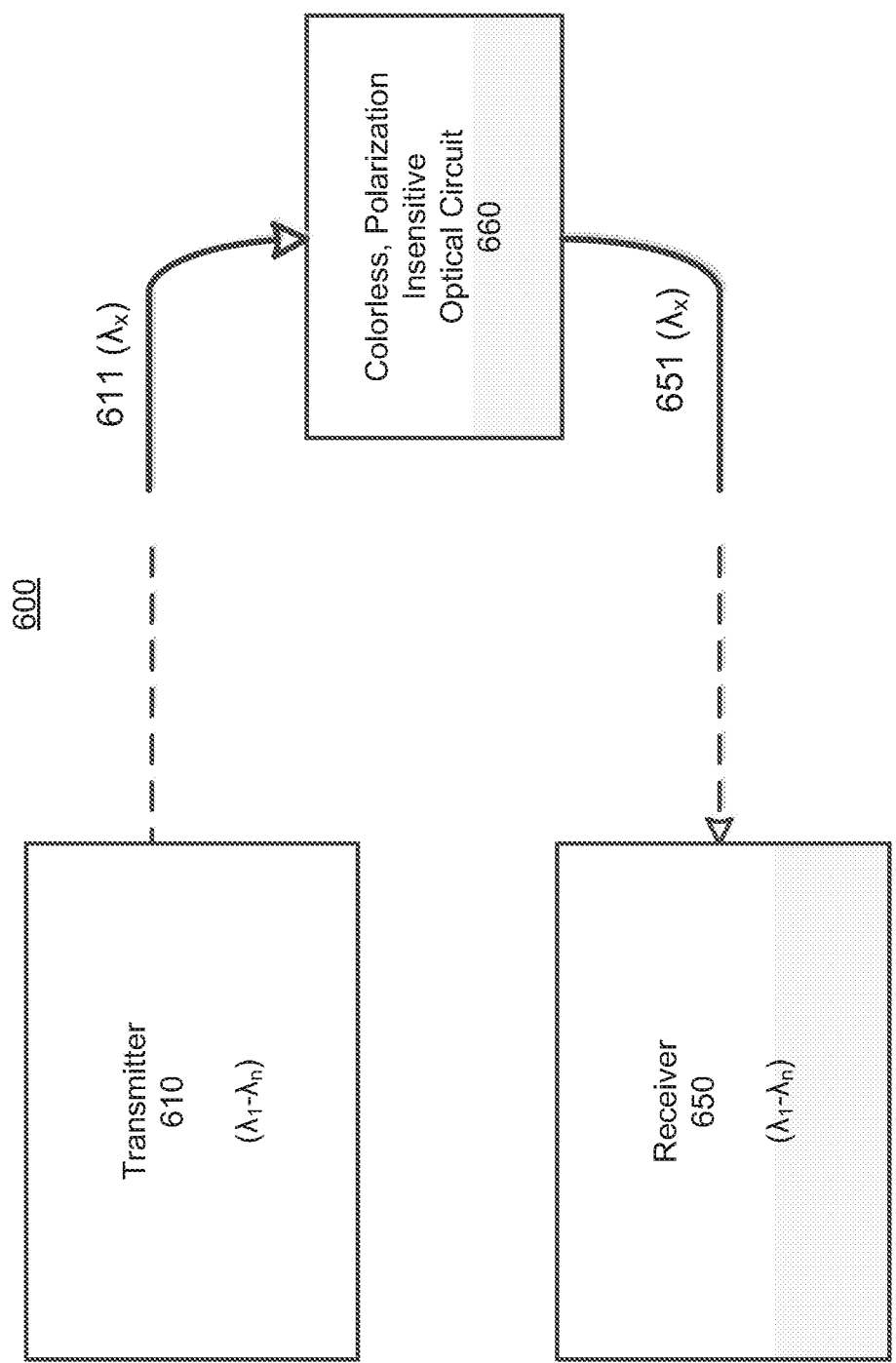
FIG. 6 illustrates a wavelength division multiplexing system utilizing one or more colorless, polarization insensitive photonic circuits according to an embodiment of the invention.

FIG. 6 illustrates a WDM system utilizing one or more colorless, polarization insensitive photonic circuits according to an embodiment the invention, hi this embodiment, WDM system 600 includes transmitter 610 and receiver 650; these components may comprise discrete components or may be included in a single transceiver. Transmitter 610 generates a WDM signal having $\lambda 1$-$\lambda n$ wavelengths, and receiver 650 receives a WDM signal comprising these same wavelengths. These WDM wavelengths may be based, for example, on, the L, C and S bands for WDM applications.

System 600 further includes colorless, polarization insensitive optical circuit 660 to receive an optical signal from transmitter 610 and returns an amplified/modulated optical signal back towards receiver 650. Circuit 660 is described as colorless, as it nay receive any of wavelengths $\lambda 1$-$\lambda n$ (and thus, the circuit is shown as receiving optical signal 611 and returning optical signal 651 comprising wavelength $\lambda x$). Returning the signal 651 can be accomplished by either transmissive embodiments of circuit 660 (as shown in FIG. 6) or reflective embodiments through the use of a circulator (not shown). Circuit 660 is described as polarization insensitive as it may comprise any of the polarization insensitive circuits described or suggested above. Utilization of these polarization insensitive components enables equal or at least substantially similar optical path lengths and gain throughout system 600 so as not to introduce polarization dependent modulation or polarization gain/loss. Thus, circuit 660 is operable for any of WDM wavelengths $\lambda 1$-$\lambda n$—i.e., no modifications are needed for the circuit to be operable for any given wavelength or polarization state of optical signals 611 and 651.

Embodiments describe an apparatus comprising a polarization mode splitter to receive light comprising at least one polarization state, a first optical path to receive light comprising a first polarization state from the polarization mode splitter, the first optical path including a first semiconductor optical amplifier to amplify the received light, a second optical path to receive light comprising a second polarization state orthogonal to the first polarization state from the polarization mode splitter, the second optical path to receive light comprising the second polarization state rotated to the first polarization state and a second semiconductor optical amplifier to amplify the received light, and at least one modulator to modulate light comprising the first polarization state.

In some embodiments, the second optical path includes a polarization rotator to rotate light comprising the second polarization state to the first polarization state. In some embodiments, the polarization mode splitter comprises a grating coupler to split light comprising the first polarization state to the first optical path and to split light comprising the second polarization state to the second optical path, and wherein the placement of the grating coupler with respect to the second optical path causes the light comprising the second polarization state to be rotated to the first polarization state.

In some embodiments, the at least one modulator comprises a single modulator to receive light from the first and the second optical paths. In some embodiments, the at least one modulator comprises a first modulator included in the first optical path, and a second modulator included in the second optical path.

In some embodiments, the above described apparatus further comprises a photodiode to receive light, wherein at least one of the modulator, the first semiconductor optical amplifier or the second semiconductor optical amplifier is controlled based, at least in part, on the light received by the photodiode. In some of these embodiments, the photodiode is to receive light prior to amplification, the photodiode is to receive light subsequent to amplification, or the photodiode is to receive light from only the first optical path.

In some embodiments, the first optical path further comprises a polarization rotator to rotate light comprising the first polarization state to the second polarization state. In some of these embodiments, the rotating light comprising the first polarization state to the second polarization state is done prior to modulating the light, and the at least one modulator comprises a polarization insensitive modulator to modulate light comprising the first polarization state and the second polarization state; in other embodiments, the rotating light comprising the first polarization state to the second polarization state is done subsequent to modulating the light.

In some embodiments, the apparatus comprises an optical transceiver to both receive and transmit light in the first and the second polarization states.

Embodiments describe an apparatus comprising a polarization mode converter to convert light comprising a first polarization state and a second polarization state orthogonal to the first polarization state to light comprising different spatial modes of the first polarization state, a semiconductor optical amplifier to amplify light comprising the different spatial modes of the first polarization state, and a modulator to modulate the amplified light comprising the different spatial modes of the first polarization state.

In some embodiments, the apparatus further comprises an additional polarization mode converter to convert light comprising different spatial modes of the first polarization state to light comprising at least one of the first or second orthogonal polarization modes. In some embodiments, the apparatus further comprises a mirror to reflect light comprising the different spatial modes of the first polarization state back to the polarization mode converter, the polarization mode converter to convert light comprising different spatial modes of the first polarization state to light comprising at least one of the first or second orthogonal polarization modes.

In some embodiments, the apparatus further includes a photodiode to receive light, wherein at least one of the modulator or the semiconductor optical amplifier is controlled based, at least in part, on the light received by the photodiode. In some embodiments, the apparatus comprises an optical transceiver to both receive and transmit light in the first and the second polarization states.

Embodiments describe a wavelength division multiplexed (WDM) system comprising a transmission component which includes an array of laser modules to produce light having different optical WDM wavelengths onto a plurality of optical paths, and a multiplexer having a plurality of inputs to receive light from each of the plurality of optical paths and to output an output WDM signal comprising the different optical WDM wavelengths. The system also includes a receiving component comprising a de-multiplexer to receive an input WDM signal comprising the different optical WDM wavelengths and to output each of the different WDM wavelengths on a separate optical path, and a photonic circuit to receive light comprising any of the different optical WDM wavelengths. The photonic circuit further includes a polarization mode splitter to receive light comprising at least one polarization state, a first optical path to receive light comprising a first polarization state from the polarization mode splitter, the first optical path including a first semiconductor optical amplifier to amplify the received light, a second optical path to receive light comprising a second polarization state orthogonal to the first polarization state from the polarization mode splitter, the second optical path to receive light comprising the second polarization state rotated to the first polarization state and a second semiconductor optical amplifier to amplify the received light, and at least one modulator to modulate light comprising the first polarization state.

Embodiments describe a wavelength division multiplexed (WDM) system comprising a transmission component which includes an array of laser modules to produce light having different optical WDM wavelengths onto a plurality of optical paths, and a multiplexer having a plurality of inputs to receive light from each of the plurality of optical paths and to output an output WDM signal comprising the different optical WDM wavelengths. The system further include a receiving component comprising a de-multiplexer to receive an input WDM signal comprising the different optical WDM wavelengths and to output each of the different WDM wavelengths on a separate optical path, and a photonic circuit to receive light comprising any of the different WDM wavelengths. The photonic circuit further comprises a polarization mode converter to convert light comprising a first polarization state and a second polarization state orthogonal to the first polarization state to light comprising different spatial modes of the first polarization state, a semiconductor optical amplifier to amplify light comprising the different spatial modes of the first polarization state, and a modulator to modulate the amplified light comprising the different spatial modes of the first polarization state.

Embodiments describe a method comprising receiving light comprising at east one polarization state, and selecting a first optical path for light comprising a first polarization state, and a second optical path for light comprising a second polarization state orthogonal to the first polarization state, wherein the second optical path includes a polarization rotator to rotate light comprising the second polarization state to the first polarization state, wherein the first and second optical paths include components to amplify and modulate light comprising the first polarization state.

In some embodiments, the first and second optical paths each include separate components to amplify and modulate light comprising the first polarization state. In some embodiments, the first and second optical paths each share at least one component to amplify or modulate light comprising the first polarization state. In some embodiments, the first optical path further comprises a polarization rotator to rotate light comprising the first polarization state to the second polarization state; wherein rotating light comprising the first polarization state to the second polarization state is done either prior or subsequent to modulating the light.

Reference throughout the foregoing specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout the specification are not necessarily all referring to the same embodiment. Furthermore, the particular features, structures or characteristics may be combined in any suitable manner in one or more embodiments. In addition, it is appreciated that the figures provided are for explanation purposes to persons ordinarily skilled in the art and that the drawings are not necessarily drawn to scale. It is to be understood that the various regions, layers and structures of figures may vary in size and dimensions.

The above described embodiments of the invention may comprise discrete devices, or may be components of a photonic integrated circuit (PIC). PICs that consist of multiple photonic components offer many advantages over those that consist of discrete photonic devices, such as higher efficiency due to the removal of coupling losses between components, fewer packages and packaging steps, smaller size, and overall better performance.

The above described embodiments of the invention may comprise SOI or silicon based (e.g., silicon nitride (SiN)) devices, or may comprise devices formed from both silicon and a non-silicon material. Said non-silicon material (alternatively referred to as "heterogeneous material") may comprise one of III-V material, magneto-optic material, or crystal substrate material.

III-V semiconductors have elements that are found in group III and group V of the periodic table (e.g., Indium Gallium Arsenide Phosphide (InGaAsP), Gallium Indium Arsenide Nitride (GaInAsN)). The carrier dispersion effects of III-V based materials may be significantly higher than in silicon based materials, as electron speed in III-V semiconductors is much faster than that in silicon. In addition, III-V materials have a direct bandgap which enables efficient creation of light from electrical pumping. Thus, III-V semiconductor materials enable photonic operations with an increased efficiency over silicon for both generating light and modulating the refractive index of light.

Thus, III-V semiconductor materials enable photonic operation with an increased efficiency at generating light from electricity and converting light back into electricity. The low optical loss and high quality oxides of silicon are thus combined with the electro-optic efficiency of III-V semiconductors in the heterogeneous optical devices described below; in embodiments of the invention, said heterogeneous devices utilize low loss heterogeneous optical waveguide transitions between the devices' heterogeneous and silicon-only waveguides.

Magneto-optic materials allow heterogeneous PICs to operate based on the magneto-optic (MO) effect. Such devices may utilize the Faraday Effect, in which the magnetic field associated with an electrical signal modulates an optical beam, offering high bandwidth modulation, and rotates the electric field of the optical mode enabling optical isolators. Said magneto-optic materials may comprise, for example, materials such as such as iron, cobalt, or yttrium iron garnet (YIG).

Crystal substrate materials provide heterogeneous PICs with a high electro-mechanical coupling, linear electro optic coefficient, low transmission loss, and stable physical and chemical properties. Said crystal substrate materials may comprise, for example, lithium niobate (LiNbO3) or lithium tantalate (LiTaO3).

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed:

1. A method for modulating light using a photonic integrated circuit, the method comprising:
    receiving, on an input waveguide of the photonic integrated circuit, a first light in a first optical spatial mode and a second light in a second optical spatial mode;
    directing the first light and the second light to different integrated optical paths comprising a first path having a first optical rotator and a second path having a second optical rotator;
    changing the second light to the first optical spatial mode using the second optical rotator on the second path;
    modulating the first light using a first optical modulator on the first path and modulating the second light using a second optical modulator on the second path while the first light and the second light are in the first optical spatial mode, the first light and the second light propagating in a same direction on the first path and the second path while being modulated by the first optical modulator and the second optical modulator;
    changing the first light to the second optical spatial mode using the first optical rotator on the first path; and
    outputting the first light and the second light on an output waveguide of the photonic integrated circuit.

2. The method of claim 1, wherein the first optical spatial mode is a transverse electric (TE) mode and the second optical spatial mode is a transverse magnetic (TM) mode.

3. The method of claim 1, wherein the first optical spatial mode comprises different spatial modes of a same polarization state, the first light and the second light being modulated while in different spatial modes of the same polarization state.

4. The method of claim 2, wherein the first optical spatial mode comprises a base TE mode and a higher order TE mode.

5. The method of claim 4, wherein the base TE mode is a TE0 mode and the higher order TE mode is a TE1 mode.

6. The method of claim 4, wherein the TM mode comprises a base TM mode.

7. The method of claim 6, wherein the method further comprises:
    changing the first light from the base TE to the higher order TE mode, and wherein the second light is changed from the base TM mode to the base TE mode.

8. The method of claim 2, wherein the photonic integrated circuit further comprises an additional mode coupler that receives the first light and the second light after amplification.

9. The method of claim 8, wherein the additional mode coupler outputs the first light and the second light from the photonic integrated circuit.

10. The method of claim 1, wherein the first light is amplified by a semiconductor optical amplifier that is in the first path.

11. The method of claim 10, wherein the second light is amplified by another semiconductor optical amplifier that is in the second path.

12. The method of claim 11, further comprising:
measuring a light intensity of at least one of the first light or the second light using a photodiode of the photonic integrated circuit.

13. The method of claim 12, further comprising:
controlling at least one of the semiconductor optical amplifier or the another semiconductor optical amplifier based on the light intensity measured by the photodiode.

14. The method of claim 1, wherein the first light and the second light are received from an optical transmitter.

15. The method of claim 14, wherein the modulated first light and the modulated second light are output to an optical receiver.

16. A photonic integrated circuit comprising:
an input waveguide to receive a first light in a first optical spatial mode and a second light in a second optical spatial mode;
a mode coupler to couple the first light and the second light from the input waveguide;
integrated optical paths comprising a first path having a first optical rotator and a second path having a second optical rotator, the first optical rotator to propagate the first light and change the first light to the second optical spatial mode, the second optical rotator to propagate the second light and change the second light to the first optical spatial mode;
a first optical modulator to modulate the first light on the first path and a second optical modulator to modulate the second light on the second path while the first light and the second light are in the first optical spatial mode, the first light and the second light propagating in a same direction on the first path and the second path while being modulated by the first optical modulator and the second optical modulator;
an additional optical coupler to form a combined light by combining the first light and the second light from the integrated optical paths; and
an output waveguide to output the combined light.

17. The photonic integrated circuit of claim 16, wherein the first optical spatial mode is a transverse electric (TE) mode and the second optical spatial mode is a transverse magnetic (TM) mode.

18. The photonic integrated circuit of claim 16, wherein the first optical spatial mode comprises different spatial modes of a same polarization state, the first light and second light being modulated while in different spatial modes of the same polarization state.

19. The photonic integrated circuit of claim 16, wherein the first light and second light are received from an optical transmitter.

20. The photonic integrated circuit of claim 16, wherein the modulated first light and the modulated second light are output to an optical receiver.

* * * * *